United States Patent [19]

Howard et al.

[11] Patent Number: 5,795,617
[45] Date of Patent: Aug. 18, 1998

[54] CHARGED COUPLED DEVICE WITH IMPROVED COATING

[76] Inventors: Roy Howard, 45 Berrel Ave., Trenton, N.J. 08619; Yair Talmi, 14 Russell Crt., New Town, Pa. 18940

[21] Appl. No.: 866,668

[22] Filed: Jun. 2, 1997

[51] Int. Cl.$^6$ ..................................................... B05D 5/12
[52] U.S. Cl. ..................... 427/58; 438/60; 438/75; 348/311
[58] Field of Search ........................ 427/58; 438/75, 438/60; 430/5; 348/311

[56] References Cited

U.S. PATENT DOCUMENTS

| | | | |
|---|---|---|---|
| 4,822,748 | 4/1989 | Janesick et al. | 437/3 |
| 5,298,363 | 3/1994 | Weiss | 430/296 |
| 5,352,897 | 10/1994 | Horikawa et al. | 250/370.06 |

*Primary Examiner*—Shrive Beck
*Assistant Examiner*—Michael Barr

[57] ABSTRACT

An improved coating for a charged coupled device is disclosed which eliminates problems caused by prior coatings. The coating does not significantly decrease quantum efficiency in any spectral range of interest.

2 Claims, 5 Drawing Sheets

CHARGED COUPLED DEVICE WITH IMPROVED COATING

TECHNICAL FIELD

This invention relates to charged coupled devices, and more particularly, to an improved coating for use with charged coupled devices (CCD) in order to improve the efficiency of certain charged coupled devices. The invention also relates to a back illuminated CCD utilizing the improved coating.

BACKGROUND OF THE INVENTION

Charged coupled devices have been in use in for many years in a variety of applications ranging from astronomy and medical technology to consumer electronics. The operation and implementation of such devices is well known to those of ordinary skill in the art and will not be described in detail herein.

One problem with CCDs is that if they are left uncoated, they will reflect rather than absorb a large percentage of the incident light energy. In order to prevent this problem, CCDs are typically coated with an antireflective coating.

Another problem which has been addressed with various solutions in the prior art is the fact that CCD devices do not have uniform response over the spectral range of interest. Specifically, the quantum efficiency of CCDs varies as a function of the wavelength of the incident light. Thus, certain wavelengths of interest, because they fall in spectral regions where the CCD exhibits poor response, do not cause substantial charge accumulation within the CCD elements.

CCDs may be used in front illuminated or back illuminated configurations. FIG. 1 shows the quantum efficiency, as a function of wavelength, of a back illuminated CCD in response to light falling upon such CCD. As can be seen, at wavelengths below 490 nm, the response of the CCD begins to greatly decrease. Accordingly, if the CCD is utilized into study wavelengths under 490 nm, poor response results.

The typical way of dealing with this problem in prior art arrangements is to coat the CCD, in addition to an antireflective coating, with one of several known coatings which shift the wavelength of the light from below the rolloff wavelength (e.g.; approximately 490 nm) to which the CCD can respond with acceptably high efficiency, up to the center of the CCD's response. By shifting the wavelength of the light to approximately 550 nm, the wavelength is placed into the central portion of the back illuminated CCD's bandwidth where the CCD has optimal response.

Lumogen is a trade name for one common coating used for the foregoing purpose. For explanation purposes herein, we refer to CCDs which are not coated with a wavelength shifting coating as uncoated. Even if the CCD is coated with an antireflective coating, we still term it uncoated if the wavelength shifting coating is missing.

FIG. 2 depicts the absorption and emission spectra for Lumogen, which shifts light from wavelengths below 490 nm to wavelengths in the region of 550 nm. As can be appreciated from FIG. 2, the Lumogen absorbs relatively short wavelengths, and emits in the relatively longer regions. Thus, energy is shifted to the longer wavelengths. The wavelengths at which the Lumogen emits are selected to fall within the spectral region at which the CCD has its maximum response.

The problem exhibited with Lumogen coated CCDs can best be seen by FIG. 3. The "notch" at the wavelengths of approximately 350 to 500 nm represents a decrease in response caused by the Lumogen coating. Specifically, while the Lumogen coating allows the CCD to respond to lower wavelengths by shifting them to a wavelength to which the CCD can respond, the Lumogen coating also detracts from the CCD's response by absorbing some of the energy which would otherwise cause charge accumulation on the CCD. This problem is caused primarily by the fact that Lumogen absorbs wavelengths of approximately 490 mn or less. Unfortunately, in the area of 490 nm, the CCD without any wavelength converting coating is approximately 70% efficient. Since the CCD's maximum efficiency is approximately 80% (See FIG. 1), the Lumogen is absorbing in a region where the CCD would otherwise be operating at 87.5% (70/80) of its maximum efficiency.

In view of the foregoing discussion, it can be appreciated that there exists a need in the art for a better technique of coating CCDs, and particularly back illuminated CCDs, so that low wavelength energy can be shifted to the wavelengths at which the CCD is more responsive, without cutting the notch out of the CCD's response. Specifically, it is desirable to not only wavelength-shift lower wavelength light signals, but to do so without degrading significantly the performance of the back illuminated CCD.

SUMMARY OF THE INVENTION

The above and other problems of the prior art are overcome in accordance with the invention which relates to a technique and particular compositions for coating the CCD in a manner that the notch previously described is not removed from the CCD's spectral response. Specifically, in one preferred embodiment, a compound known as Unichrome and which has the chemical structure set forth at FIG. 6 hereof may be utilized. In a more general embodiment, well known Woodward rules can be utilized in order to determine compounds which will absorb in wavelength regions well below the region to which the CCD is responsive, and emit within the CCD's response region.

Unlike Lumogen, Unichrome does not emit in a portion of the spectrum where the back illuminated CCD has its near maximum response. Rather, Unichrome emits at approximately 425 nm, where the CCD, without any wavelength shifting coating, has less than optimal response. (See FIG. 1). Thus, one might expect a poorer overall response from a Unichrome coated CCD than from a Lumogen coated CCD. Nonetheless, because Unichrome does not absorb significant energy above 375 nm, the previously described "notch" is eliminated and overall performance is improved.

DETAILED DESCRIPTION OF THE PREFERRED EMBODIMENT

Figure 1:
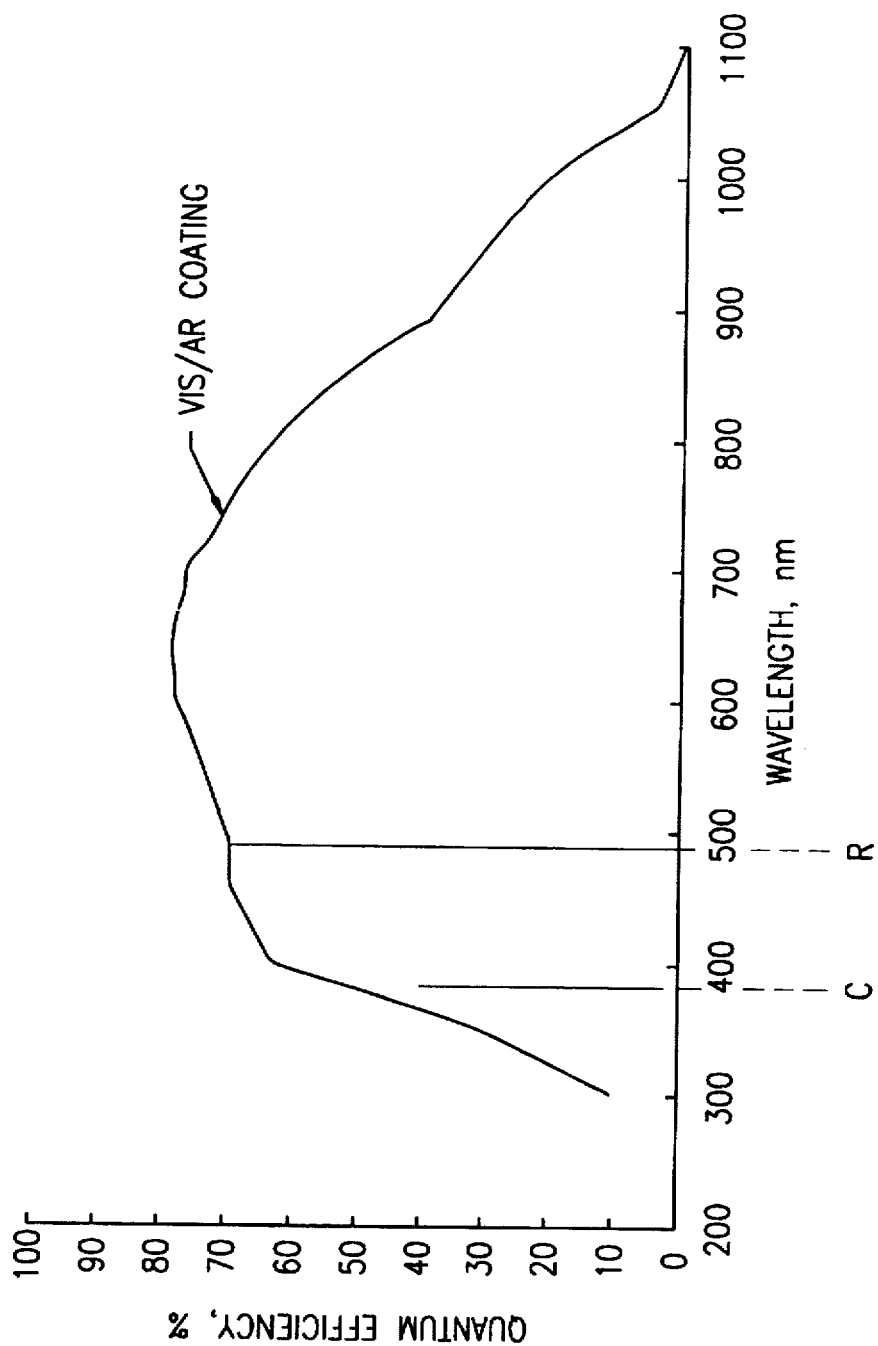
FIG. 1 shows a plot of the response of an uncoated back illuminated CCD device.
Figure 4:
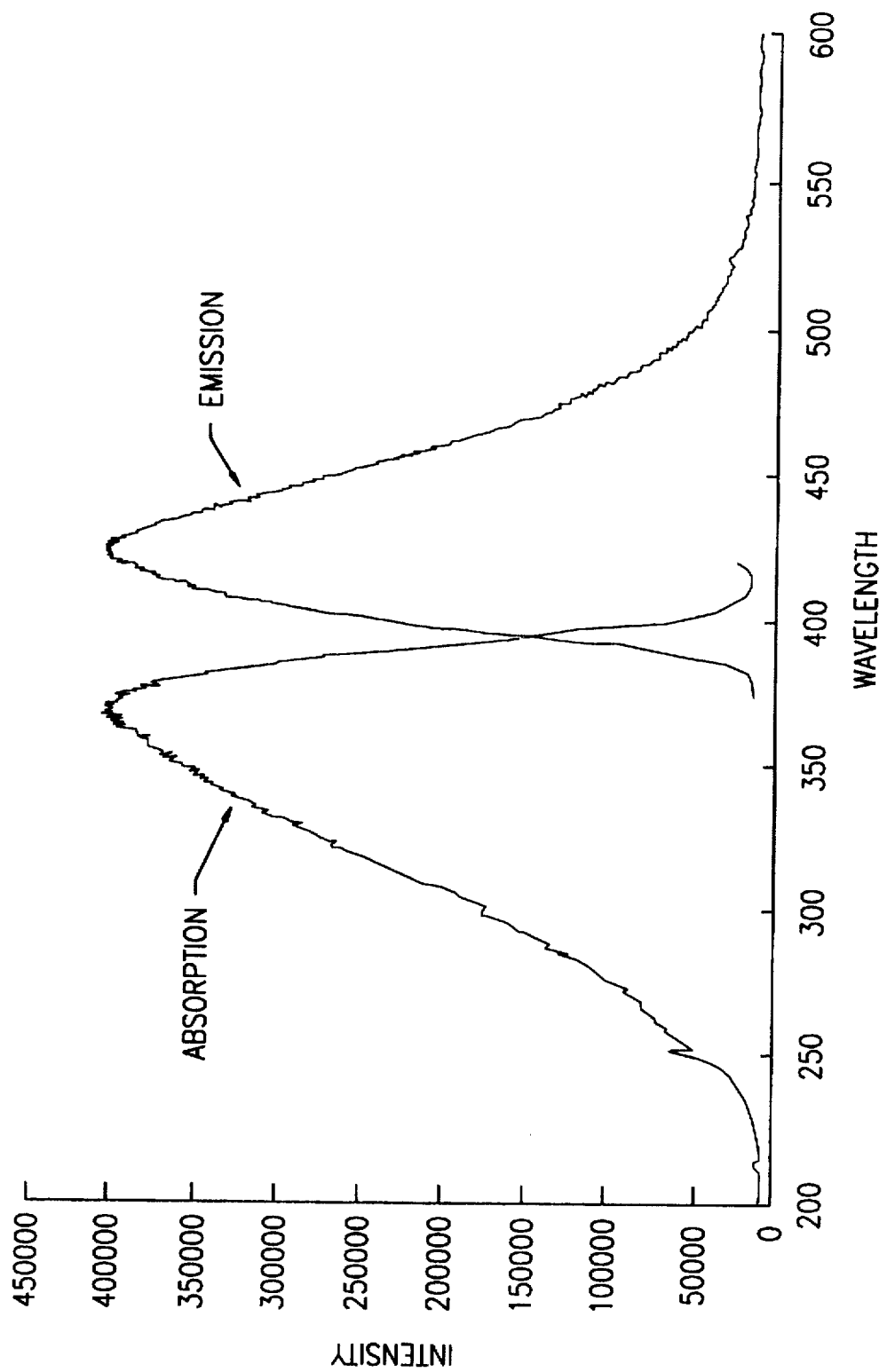
FIG. 4 shows the absorption and emission spectra of Unichrome.
Figure 5:
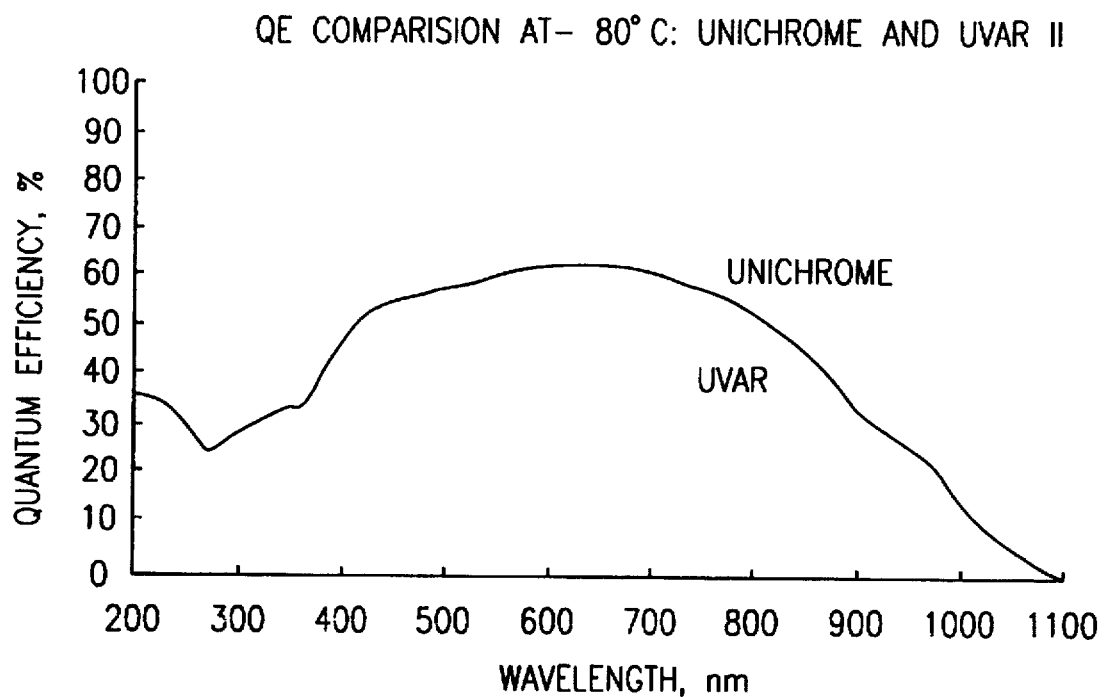
FIG. 5 shows the spectral response of a Unichrome coated CCD.
Figure 6:
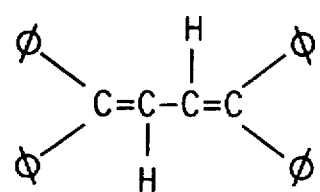
FIG. 6 shows the chemical structure of Unichrome.

FIG. 4 shows the absorption and emission spectra of Unichrome. The spectral response is different from that of Lumogen. As previously described, it can be appreciated from FIG. 4 that the Unichrome emits most of its energy in the region of 400–450 nm, centering around 425 nm. As FIG. 1 shows, this is not where the optimal response of the CCD is. Rather, the region of 425–450 nm is where the response of the CCD has significantly degraded. Thus, the teachings of this art have traditionally not sought to wavelength shift low wavelengths into the aforementioned wavelength range because it has always been believed important to shift into a spectral region of good response.

Importantly, while the prior art always attempted to shift the low wavelength energy into the region of the spectrum at which the CCD is most responsive, the present invention shifts the low wavelength energy into a region of the spectrum at which the CCD does not have optimal response. Additionally, the uncoated CCD has less than optimal response in the 375 nm–500 nm wavelength range. While prior Lumogen coated CCD's shifted these wavelengths, the Unichrome devices do not absorb in this region, but only absorb in the region of approximately 375 nm and below.

To summarize the foregoing, we refer to FIG. 1 for a discussion of two major features of the present invention. It can be appreciated that at approximately 490 nm and below, the uncoated CCD's response begins to drastically decline. Thus, the prior art Lumogen was used to convert wavelengths below this "rolloff wavelength" up to 550 nm, the best part of the CCD's response. In the present invention, wavelengths from 375–490 nm, where the response of the uncoated CCD is significantly diminished, are nonetheless not absorbed and remitted. Rather, the slightly diminished response of the CCD is accepted for these wavelengths.

Figure 2:
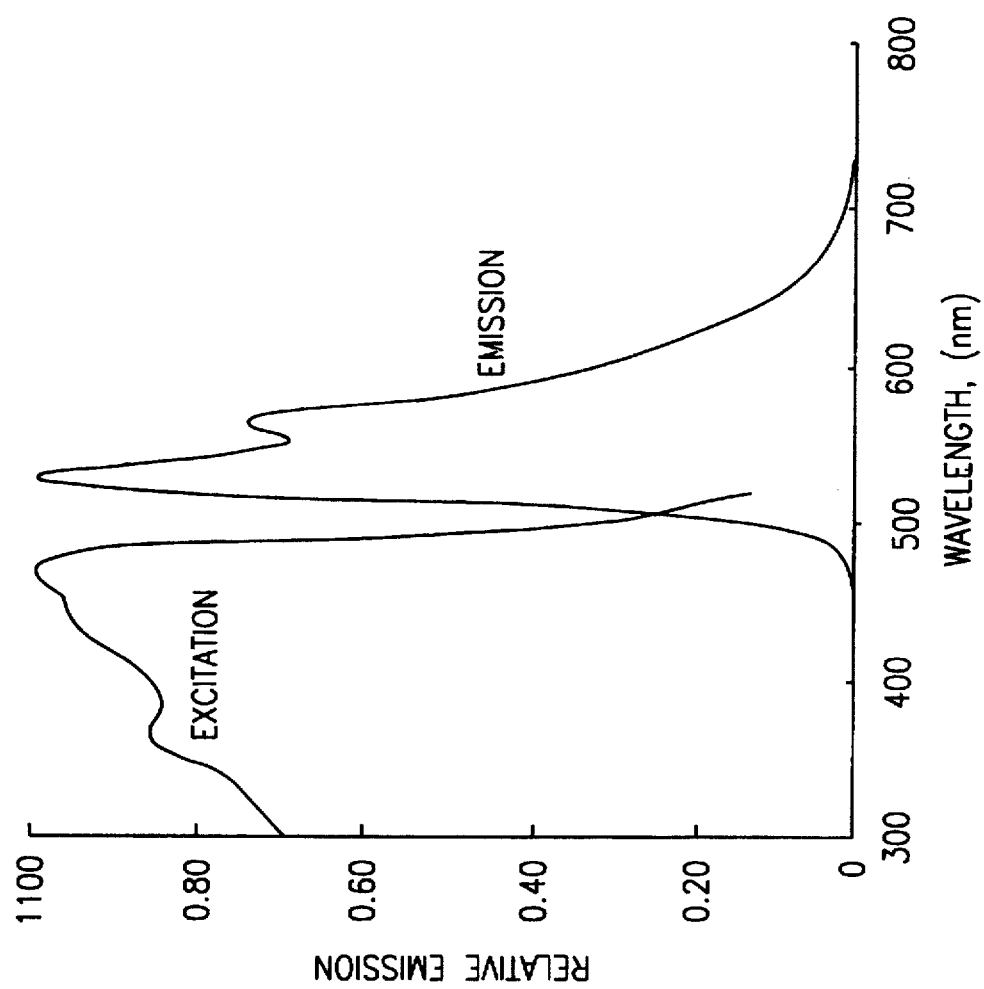
FIG. 2 shows the absorption and emission spectra of Lumogen a coating used in the prior art.
Figure 3:
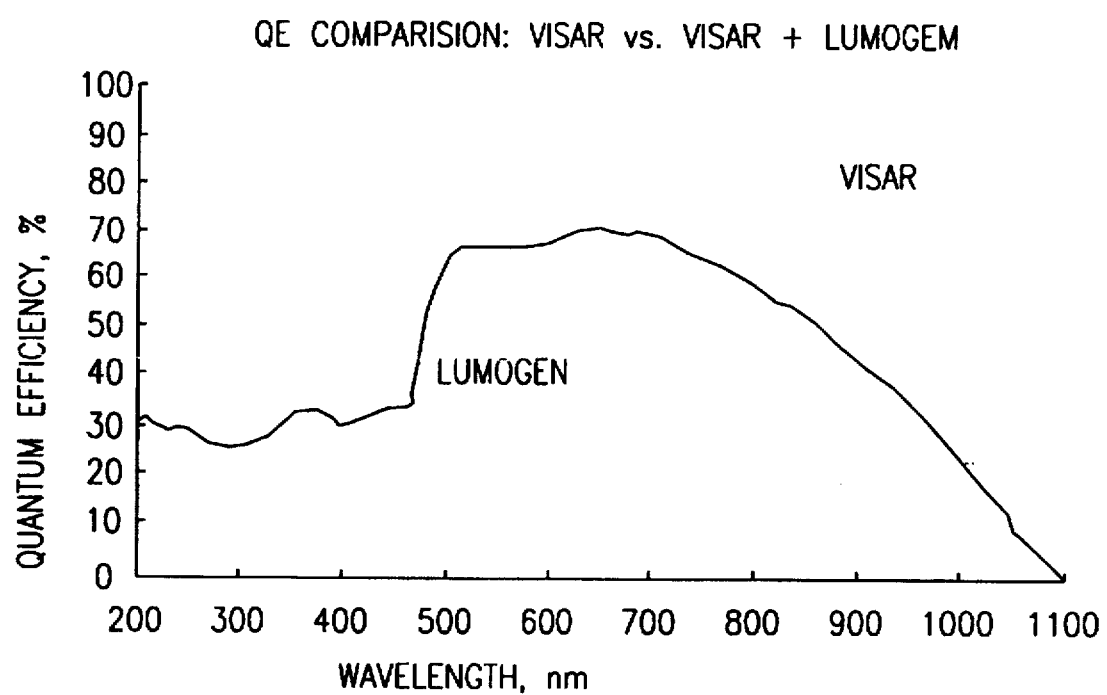
FIG. 3 is a plot of the frequency response of a Lumogen coated CCD.

Second, the conventional teachings were to use an emission wavelength of approximately 550 nm, since this is the central portion of the CCD's response. In the present invention, the energy is emitted at approximately 425 nm, where the CCD has significantly diminished, yet acceptable, response. In exchange for the foregoing sacrifices however, the notch previously described with respect to FIG. 2 is eliminated.

Thus, the Unichrome, when compared with the Lumogen (i) emits at a portion of the spectral region where the uncoated CCD's response is less than optimal and (ii) does not absorb and shift wavelengths in the 490–375 nm range, even though the uncoated CCD's response is less than optimal.

Reviewing the response of the uncoated back illuminated CCD, we define the point C in FIG. 1 as the cutoff point. The cutoff point is a point towards the lower wavelength end of the spectral response of the CCD. Wavelengths below the cutoff point are not detected with a significant degree of quantum efficiency by the uncoated CCD. For exemplary purposes herein, we choose a cutoff point where the quantum efficiency of the CCD is 40%. The cutoff point may be chosen differently, but is always a point where the response is much less than the maximum response. In the example of FIG. 1, the cutoff point is approximately 375 nm.

We define a rolloff point R as a point where the response begins decreasing continuously and steeply as wavelength is decreased. Referring to FIG. 1, prior art systems always used coatings to shift wavelengths from below the roll off point to above the rolloff point. In the inventive system, wavelengths are shifted from below the cutoff point to above the cutoff point but still below the rolloff point.

It has also been determined that the Unichrome coated CCD exhibits much better etaloning properties then the Lumogen, and much better performance at lower temperatures. This feature may be particularly important for low temperature CCD operation which is utilized in certain applications.

While the above describes the preferred embodiment of the invention, various other modifications and/or additions would be apparent to those of ordinary skill in the art. Such modifications are intended to be covered by the following claims.

What is claimed is:

1. A method of treating a charged coupled device (CCD) having a bandwidth of response, said bandwidth having cutoff and rolloff wavelengths said method comprising the steps of:

selecting a compound capable of shifting energy from wavelengths below said cutoff wavelength to wavelengths above said cutoff wavelengths but below said rolloff wavelength; and coating said CCD with said compound, said compound being tetraphenylbutadiene.

2. A method of coating a back illuminated CCD comprising;

determining a rolloff wavelength below which the CCD begins exhibiting degraded response;

selecting a cutoff wavelength below which CCD response is unacceptable;

coating the CCD with a compound such that wavelengths are shifted from below said cutoff wavelength to above said cutoff but below said rolloff wavelength, said rolloff wavelength being approximately 490 nm and said cutoff wavelength being approximately 375 nm said compound being tetraphenylbutadiene.

* * * * *